United States Patent
Pandya et al.

(10) Patent No.: US 9,699,549 B2
(45) Date of Patent: Jul. 4, 2017

(54) AUDIO CAPTURING ENHANCEMENT METHOD AND AUDIO CAPTURING SYSTEM USING THE SAME

(71) Applicant: ASUSTeK COMPUTER INC., Taipei (TW)

(72) Inventors: Bhoomek D. Pandya, Taipei (TW); Nikhil Bhave, Taipei (TW)

(73) Assignee: ASUSTeK COMPUTER INC., Taipei (TW)

(*) Notice: Subject to any disclaimer, the term of this patent is extended or adjusted under 35 U.S.C. 154(b) by 59 days.

(21) Appl. No.: 14/673,886

(22) Filed: Mar. 31, 2015

(65) Prior Publication Data
US 2016/0295320 A1 Oct. 6, 2016

(51) Int. Cl.
*H04R 3/00* (2006.01)
*H04R 1/40* (2006.01)
*G10L 21/0208* (2013.01)
*G10L 25/78* (2013.01)
*G10L 21/0216* (2013.01)
*G10L 25/12* (2013.01)
*H03G 3/30* (2006.01)

(52) U.S. Cl.
CPC .......... *H04R 1/406* (2013.01); *G10L 21/0208* (2013.01); *H04R 3/005* (2013.01); *G10L 25/12* (2013.01); *G10L 25/78* (2013.01); *G10L 2021/02166* (2013.01); *H03G 3/3005* (2013.01); *H04R 2430/25* (2013.01)

(58) Field of Classification Search
CPC  H04R 3/005; H04R 2203/12; H04R 2410/01; H04R 2430/21; G10L 19/12
USPC ................... 381/92, 94.7, 93, 102; 704/219
See application file for complete search history.

(56) References Cited

U.S. PATENT DOCUMENTS

| | | | | |
|---|---|---|---|---|
| 6,317,501 | B1 * | 11/2001 | Matsuo | H04R 3/005 381/122 |
| 2002/0138254 | A1 * | 9/2002 | Isaka | G10L 21/02 704/208 |
| 2006/0210096 | A1 | 9/2006 | Stokes, III et al. | |
| 2007/0003078 | A1 * | 1/2007 | Escott | H03G 7/007 381/107 |
| 2013/0108066 | A1 * | 5/2013 | Hyun | H04R 3/005 381/59 |
| 2014/0219471 | A1 | 8/2014 | Deshpande et al. | |

FOREIGN PATENT DOCUMENTS

CN  101193460  6/2008

* cited by examiner

*Primary Examiner* — Alexander Jamal
(74) *Attorney, Agent, or Firm* — Jianq Chyun IP Office

(57) ABSTRACT

Accordingly, the present disclosure is directed to an audio capturing enhancement method and an audio capturing system using the same method. The audio capturing system includes at least but not limited to two microphones for recording an audio data, an amplifier coupled to the at least two microphones for adjusting the audio data by applying automatic gain control (AGC) in order to generate a gain adjusted data that is within a predefined level, and a processing circuit coupled to the amplifier for calculating a linear predictive coding (LPC) residue of the gain adjusted data, determining from the LPC residue a first source at a first direction relative to the at least two microphones based on time different of arrival (TDOA), and attenuating any source at a second direction that is outside of a predefined direction.

20 Claims, 8 Drawing Sheets

AUDIO CAPTURING ENHANCEMENT METHOD AND AUDIO CAPTURING SYSTEM USING THE SAME

TECHNICAL FIELD

The present disclosure is directed to an audio capturing enhancement method and an audio capturing system using the same method.

BACKGROUND

An audio capturing system is a system that captures, transmits, and stores audio signals using one or multiple microphones. An audio capturing system may also support other systems such as speech recognition and speaker identification in order augment their capabilities. A well designed audio capturing system would provide good recording quality even under highly noisy conditions. Also the signal processing unit of this system should be efficient in terms of computational complexity.

For an audio capturing system with multiple microphones, a widely known technique is often referred to as "beamforming" where the time difference between signals due to spatial difference of microphones is used to process, enhance, or filter speech signals. Another useful related technique is the time difference of arrival (TDOA) which calculates directions of audio sources based on the path difference between arriving waves at the microphones from the source. By calculating the directions of audio sources, input speech can be analyzed and interference patterns from sources in undesired directions could be deduced for cancellation.

To analyze speech signals, linear predictive coefficient (LPC) residue could be used in combination with beamforming. LPC analyzes the speech signal by estimating the formants, removing their effects from the speech signal, and estimating the intensity and frequency of the remaining buzz. The process of removing the formants would involve inverse filtering, and the remaining signal after the subtraction of the filtered model signal is called the residue. The residue contains important excitation source information which is very useful for TDOA. The residue removes the second order correlation among samples of the signal and produces large amplitude fluctuations around the instants of significant excitation (high signal to noise ratio). LPC residue based TDOA has been known to be more reliable than raw signal TDOA.

SUMMARY OF THE DISCLOSURE

Accordingly, the present disclosure is directed to an audio capturing enhancement method and an audio capturing system using the same method.

In one of the exemplary embodiments, the present disclosure is directed to an audio capturing enhancement method that includes at least but not limited to recording an audio data by using at least two microphones, adjusting the audio data by applying automatic gain control (AGC) in order to generate a gain adjusted data that is within a predefined level, calculating a linear predictive coding (LPC) residue of the gain adjusted data, determining from the LPC residue sources in a desired direction of capture direction relative to the at least two microphones based on time different of arrival (TDOA), and attenuating any source at any direction that is outside of a predefined desired spatial direction.

In one of the exemplary embodiment, the present disclosure is directed to an audio capturing system that includes at least but not limited to at least two microphones for recording an audio data, an amplifier coupled to the at least two microphones for adjusting the audio data by applying automatic gain control (AGC) in order to generate a gain adjusted data that is within a predefined level, and a processing circuit coupled to the amplifier for calculating a linear predictive coding (LPC) residue of the gain adjusted data, determining from the LPC residue a first source at a first direction relative to the at least two microphones based on time different of arrival (TDOA), and attenuating any source at a second direction that is outside of a predefined angle.

In order to make the aforementioned features and advantages of the present disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the present disclosure and is therefore not meant to be limiting or restrictive in any manner. Also the present disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
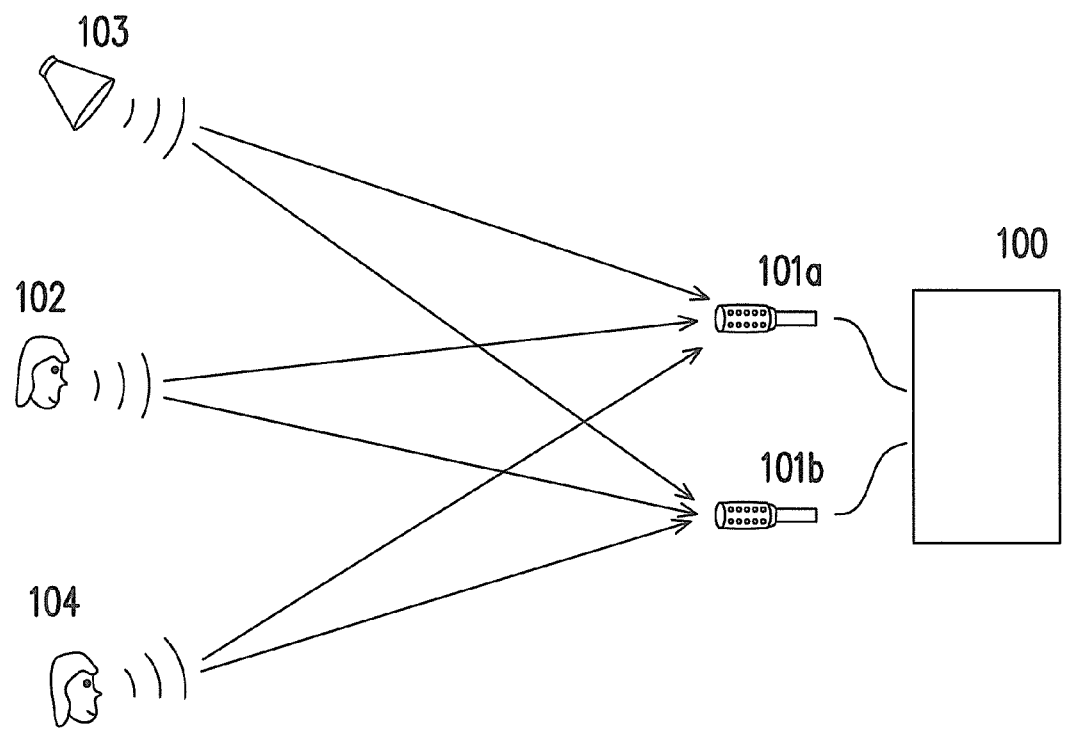
FIG. 1A is a conceptual diagram that illustrates filtering based on desired or undesired sources in accordance with one of the exemplary embodiments of the present disclosure.

Reference will now be made in detail to the present exemplary embodiments of the disclosure, examples of which are illustrated in the accompanying drawings. Wherever possible, the same reference numbers are used in the drawings and the description to refer to the same or like parts.

The method and system of the present disclosure aim to enhance audio signal captures for purposes of storage, transmission, speech recognition, speaker identification, and so forth by capturing speech from multiple microphones. The present disclosure proposes an algorithm to improve the signal quality of the captured signal. By judging the presence of a user in a desired direction relative to the microphones and by removing other interferences from undesired directions, initial experimental results have shown that the recognition accuracy of a speech recognition system has increased by up to 10% when tested under noisy conditions. This means that the recording device can continuously listen to a desired direction without being falsely triggered in to action by noise from other directions. For real time applications, reducing computation time is of high priority. Also for constant computation time, a good buffering strategy is needed. Considering these criteria, a scheme to enhance audio captures is proposed.

FIG. 1A is a conceptual diagram that illustrates filtering based on desired or undesired sources in accordance with one of the exemplary embodiments of the present disclosure. For the exemplary scenarios of FIGS. 1A~1C, the audio capturing system 100 deploys two microphones, 101a and 101b, in an environment that may include at least three sources, the first source 102, the second source 103, and the third source 104. However, it would apparent for an ordinary person, one skilled in the art that more than 2 microphones could be used to capture speech signals. The first source 102 and the third source 104 are assumed to be human speech, and the second source 103 is assumed to be a non-human source such as a speaker broadcasting human voice or music or other sounds. Conventionally, a typical audio capturing system would capture all three sources 102~104; however, this might not be what is intended as a user of the audio capturing system might only be interested in a dominant source or sources that are aligned with the microphones or are closest to the microphones. By eliminating effect of undesired sources, the accuracy and efficiency of the audio capturing system 100 would be enhanced.

Figure 1B:
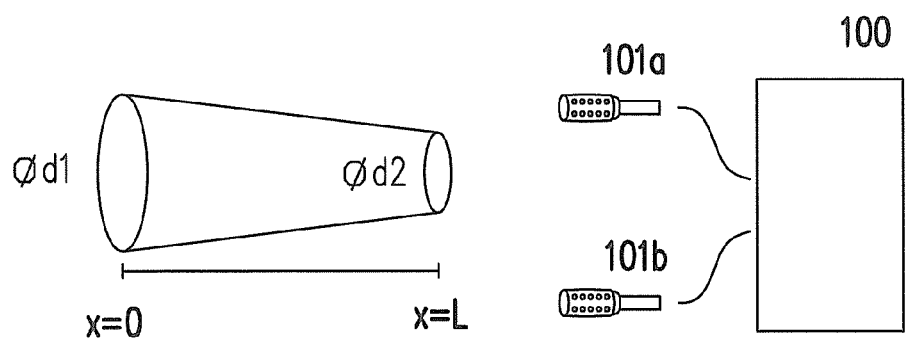
FIG. 1B illustrates a conceptual diagram that illustrates defining a cone of acceptance angle and capturing distance in accordance with one of the exemplary embodiments of the present disclosure.

Thus, a capturing cone that has an acceptance angle and a maximum distance could be defined in order to capture audio signals within the defined capturing cone. FIG. 1B illustrates a conceptual diagram that illustrates defining a cone having an acceptance angle and a capturing distance in accordance with one of the exemplary embodiments of the present disclosure. The capturing cone could be a three dimensional cone that captures audio signals within a certain space. However, for the ease of illustration, the capturing cone is assumed to be two dimensional. The exemplary capturing cone of FIG. 1B has an acceptance angle $\Phi_{d1}$ at the maximum distance denoted by x=L and an acceptance angle $\Phi_{d2}$ at x=0. The distance L is the maximum distance beyond which audio signals would be ignore by the audio capturing system. The maximum distance could be, for example, 1 meter. The distance at x=L could be defined to be right at the two microphones or right at a place displaced by a certain distance. The range of the acceptance angles $\Phi_{d1}$ and $\Phi_{d2}$ could be, for example, about 30 degrees. The angle $\Phi_{d1}$=0 or $\Phi_{d2}$=0 could be defined as to be in perfect alignment with the two mics. The audio signals within the range of acceptance angles $\Phi_{d1}$ and $\Phi_{d2}$ would be considered as desired input audio signals, and the audio signals outside of the acceptance angles Φd1 and Φd2 would be masked or filtered out. For the scenario of FIG. 1B, the first source 102 could be determined as a valid source to be recorded while the second source 103 and the third source 104 could be filtered out.

The capturing distance, x, could be measured on the basis of signal strength and the confidence of a direction measurement unit. The signal strength and the angle measurement confidence would lower as a source moves further and further away from the microphones 101a and 101b. When the capturing distance, x, exceeds L, the audio source could be discarded. The direction of a source could be measured based on the TDOA principle. For example, if a source is at a location that is equal distance to both microphones 101a and 101b, the source would be received by both microphones 101a and 101b with almost no delay. If the source is displaced toward one of the microphones (e.g., 101a and 101b) but away from the other, one of the microphones 101a and 101b would receive the audio signal sooner than the other. On the basis of the differences in delay of the audio signals, the direction of the source could be calculated so that the audio capturing system 100 may know whether a source is within the range of acceptance angles $\Phi_{d1}$ and $\Phi_{d2}$.

Figure 1C:
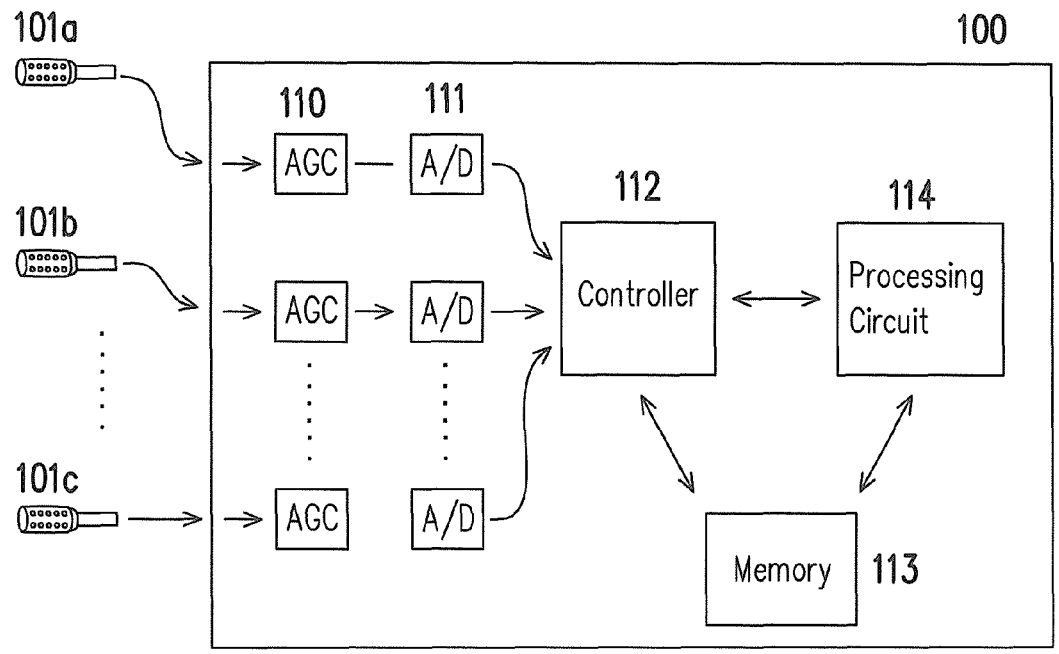
FIG. 1C is a block diagram that illustrates an exemplary audio capturing system of the present disclosure.

FIG. 1C is a block diagram that illustrates an exemplary audio capturing system of the present disclosure. The proposed audio capturing system 100 may include multiple speakers 101a, 101b . . . 101c, etc. to be capture an audio signal. In one of the exemplary embodiments, the speakers 101a~101c would be electrically coupled to an automatic gain control (AGC) circuit 110 to generate an adjusted audio signal. The AGC circuit 110 would be electrically coupled to an analog to digital (A/D) converter so that the adjusted audio signal would be converted to a digital audio signal.

In an alternative embodiment (not shown), the captured audio signal would be fed to a pre-amp to boost the captured audio signal. The boosted audio signal would then be converted to a digital format by an A/D converter. The digital audio signal could then be controlled by a software implemented AGC circuit.

The AGC circuit 110 is used to stabilize the gain of the input audio. In this way, the use of AGC would allow the audio capturing system 100 to have a better far-field capture. Also the signal to noise ratio of the input speech would be enhanced by AGC since the AGC could be configured to not boost noise signal. An upper threshold and a lower threshold could be imposed on the adjusted audio signal so that the adjusted audio signal would be within a specific range. For example, when the audio signal is below the lower threshold, it could be considered to be background noise and be ignored. The input audio signal could be AGC adjusted to be centered at a particular level. For example, the adjusted audio signal could be centered at ¼ of the total dynamic range of the AGC. In this way, the conversion time could be decreased as adjusted audio signal is centered at a lower level of the dynamic range of the AGC.

As for FIG. 1C, the digital audio signal would be transmitted to a processing circuit 114 via a controller 112. The controller 112 would serve as an interface among the digital audio signal, memory 113, the processing circuit 114, and other peripheral devices (not shown). The controller 112 could be, for example, a chipset that includes a North Bridge and a South Bridge. The memory 113 could be a volatile memory that serves as a buffer memory and/or could be a non-volatile memory that stores the digital audio signal. The processing circuit 114 could include one or more programmable units such as a micro-processor, a micro-controller, a GPU, a DSP chips, and FPGA, etc.

Figure 1D:
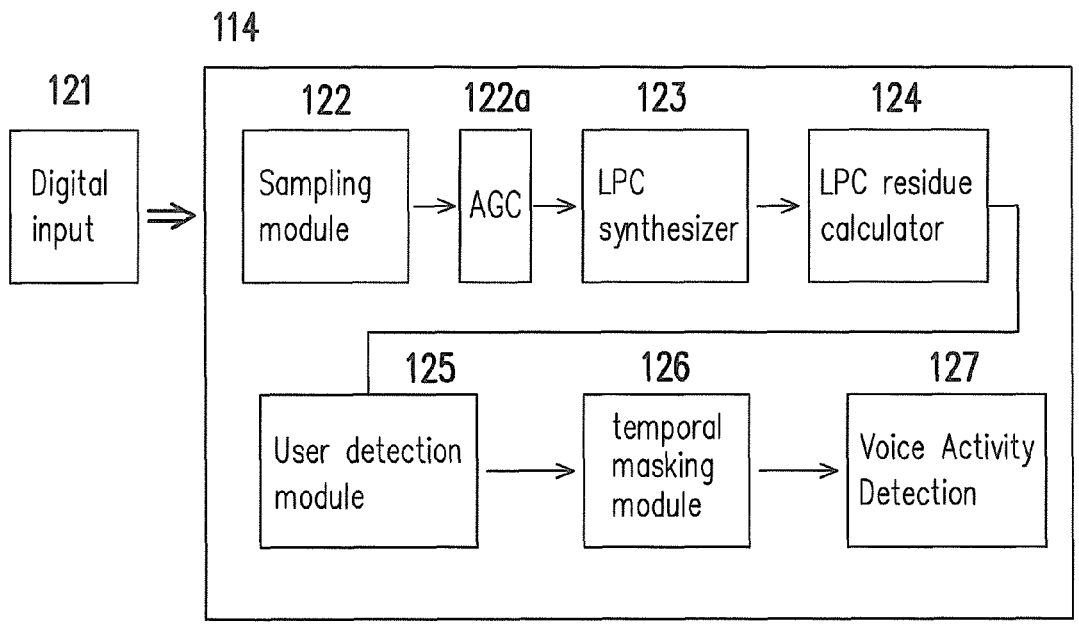
FIG. 1D is a block diagram illustrates an exemplary processing circuit of the present disclosure in terms of block diagrams.

FIG. 1D is a block diagram illustrates an exemplary processing circuit of the present disclosure in tell is of block diagrams. The exemplary processing circuit 114 could be configured to receive a digital input 121 from the controller 112. The digital input 121 would be transmitted to a sampling module 122. The sample module 122 may perform and a windowing operation to the digital input 121 to generate a windowed speech. An AGC block 122a may receive the output of the sample module 122 to provide a stabilizing gain control. The LPC synthesizer 123 could be electrically coupled to the AGC block 122a and would receive the gain adjusted windowed speech and calculate LPC coefficients of the windowed speech. The LPC residue calculator 124 is electrically coupled to the LPC synthesizer 123 and would calculate the LPC residue of the LPC coefficients. The user detection module 125 is electrically coupled to the LPC residue calculator 124 and would detect the number of users and their directions.

In particular, the user detection module 125 would be able to detect the number of users by calculating a correlation between LPC residues of at least two microphones, and then a histogram containing the correlation will be compiled. Peak detections will be performed on the histogram, and then the number of users could be determined by the number of peaks exceeding a certain threshold.

The user detection module 125 would also be able to detect the direction of sound sources and whether the directions of the users are within the range of the acceptance angle of a capturing cone. The direction of sound sources could be determined based on the TDOA technique (based on correlation of LPC residues) by measuring the difference in the time of arrival of a sound wave. In other words, if a sound carrying a specific audio pattern arrives at a first microphone before a second microphone, then the source of the sound carrying the specific audio pattern would be at an angle closer to the first microphone. After the direction of sound sources have been determined and after a capturing cone has been defined, the user detection module 125 would be able to determine the number and direction of sound sources and whether these sound sources are within the capturing cone.

The temporal masking module 126 would receive the calculated LPC residue as well as the aforementioned results from the user detection module 125. If it has been determined that there are extrinsic sound sources that fall outside of the maximum distance or outside of the range of the acceptance angle, the temporal masking module 126 would attempt to filter out the sound components generated by these extrinsic sound sources. For example, a least mean square (LMS) filter could be used to filter out the sound component of a particular direction. In this case, the temporal masking module 126 would apply the LMS filter to the audio signal to prevent extrinsic sound sources from contributing to the AGC adjusted audio signal.

The voice activity detector (VAD) 127 is an optional component and could be used to detect whether an audio signal is a human speech. The VAD 127 could also be activated to decipher an audio signal and to generate a text equivalence of the audio signal using a voice recognizing engine. In one of the exemplary embodiments, the VAD 127 is disabled so that a non-human sound could be recorded. In one of the exemplary embodiments, the VAD 127 is enabled to determine whether a captured audio signal is a human voice. The captured audio signal could be discarded if the captured audio signal is not a human voice. The VAD 127 could also be used to recognize the human voice and a voice recognition engine can be used to generate a text file based on a received human speech.

Figure 2:
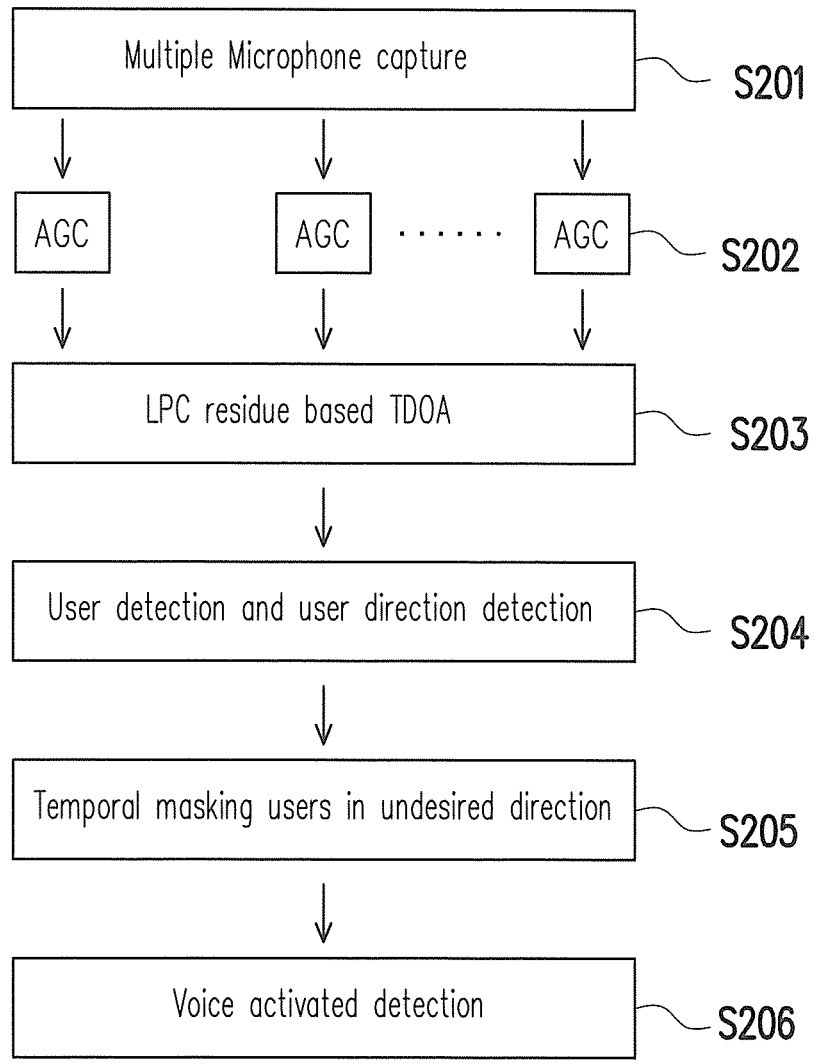
FIG. 2 is a process diagram that illustrates an audio capturing system of the present disclosure in accordance with one of the exemplary embodiments of the present disclosure.

FIG. 2 is a process diagram that illustrates an audio capturing system of the present disclosure in accordance with one of the exemplary embodiments of the present disclosure. In step S201, a sound is captured via multiple microphones and stored in a volatile or non-volatile memory of a sound capturing system. The multiple microphones contain at least a transducer that converts from sound vibrational signals into electrical signals. The multiple microphones may also contain a front end pre-amp takes boost the signal to noise ratio of captured audio signals. In step S202, the signals captured by each of the microphones would be gain adjusted by an AGC circuit. In particular, the signals captured by each of the microphones would be gain adjusted to a volume of ¼ the maximum dynamic range of the Microphone.

In step S203, LPC coefficients and then LPC residues would be calculated for the audio signals captured by each of the microphones. In step S204, the number of sound sources within a defined capture area and the direction of the sound sources would be determined. Based on the difference in time arrival of sound waves captured among the at least two microphones, the direction of the sound sources could be discerned. Also besides the location or orientation of the sound sources relative to the speaker, the number of distinct sound sources could also be determined by calculating the correlation among the LPC residues of different microphones. After a histogram analysis is performed, the different sound sources could be distinguished by detecting the peaks of the histogram. After identifying each of the sound sources and their directions, any sound sources that are outside of a predefined capture cone could be identified. The capture cone could be predefined to have a range of acceptance angle to be about 30 degrees for example, and the maximum distance of the capture cone could be defined to be 1 meter for example. However, the present disclosure does not limit to these exact instances.

In one of the exemplary embodiments, the dominant sound source and secondary sound source(s) could be identified and sequentially enumerated based on the volume of a sound voice. Also if the volume of a sound voice is not above a certain threshold, the sound voice could be discarded as background noise.

In step S205, the temporal masking could be performed to filter out users in undesired directions or outside of the maximum distance. In detail, the sound sources that are outside of capture cone could be filtered out by using an adaptive filter such as a least means square (LMS) filter. The filter can adapt coefficients depending on income audio signals and the adaptation can be controlled by user detection logic of step S204.

After temporal masking has been performed, in an optional step S206, a voice activated detection (VAD) could be implemented. The VAD would ignore users outside of the capture cone since these components have been attenuated back in step S205. The VAD could be used to determine whether an income voice is a human voice or a non-human voice. In one of the exemplary embodiments, the VAD could be activated and configured to ignore components of captured audio signal that is non-human. After a captured audio signal has been identified as a human voice, the VAD may execute additional features such as speech recognition, speech identification, etc. In one of the exemplary embodiments, the VAD could be disabled so that non-human voices could be detected.

Figure 3:
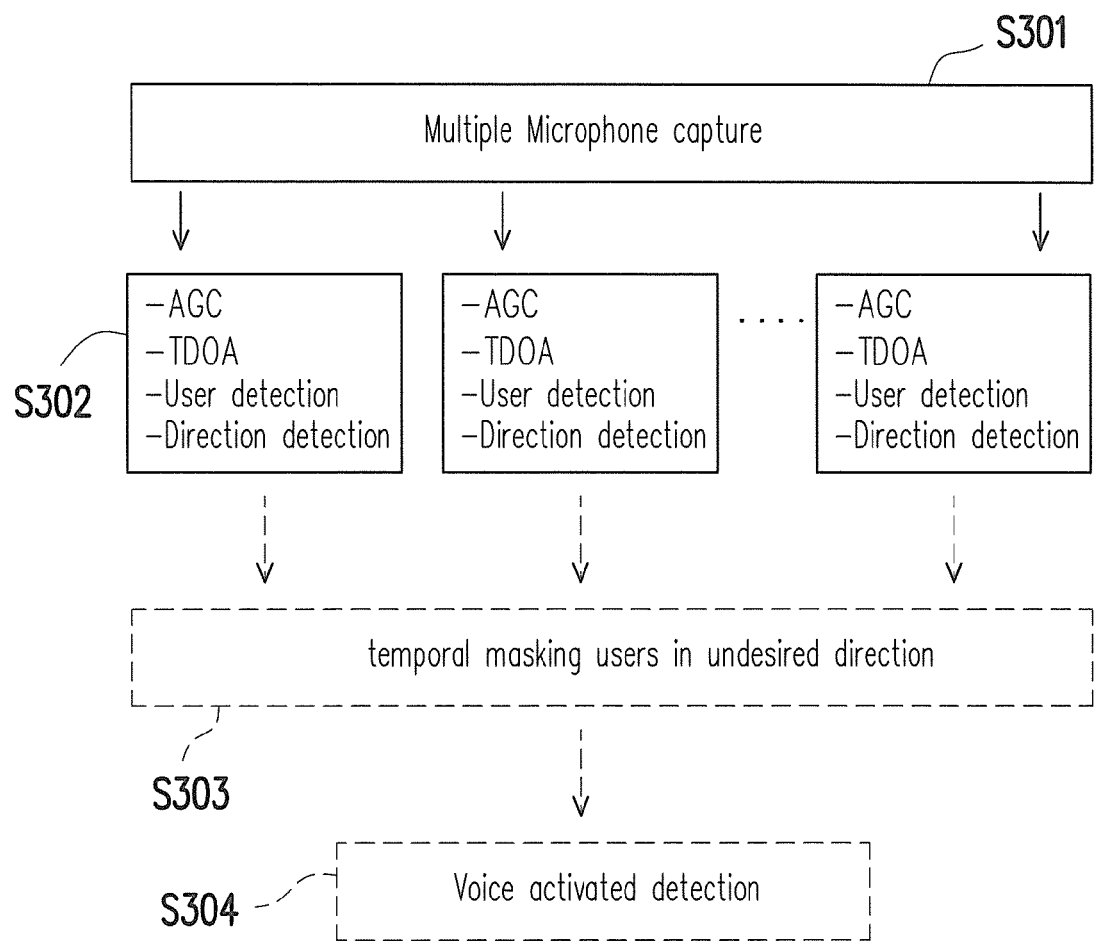
FIG. 3 is a process diagram that illustrates an audio capturing system of the present disclosure in accordance with one of the exemplary embodiments of the present disclosure.

FIG. 3 is a process diagram that illustrates an audio capturing system of the present disclosure in accordance with one of the exemplary embodiments of the present disclosure. The exemplary embodiment of FIG. 3 would be similar to the exemplary embodiment of FIG. 2 except that some components of FIG. 2 could be integrated into a system of reusable modules. In detail, in step S301 a sound wave could be captured by multiple microphones. In step S302, for one of the exemplary embodiments, aforementioned functions including the AGC, LPC residue based TDOA, sound source (or user) detection and direction detection could be integrated into a module. For example, the module could be an integrated IC, and each of the multiple microphones could share the integrated IC. In an alternative embodiment, the module including AGC, LPC residue based TDOA, sound source (or user) detection and directional detection could be several identical modules with each module connecting to a different microphone. In the optional step S303, the temporal masking could be performed to filter out sound sources (or users) in undesired directions or beyond the desired distance. In the optional step S304, the VAD could be deactivated or activated to recognize a human so as to implement features related to automatic speech recognition (ASR).

Figure 4:
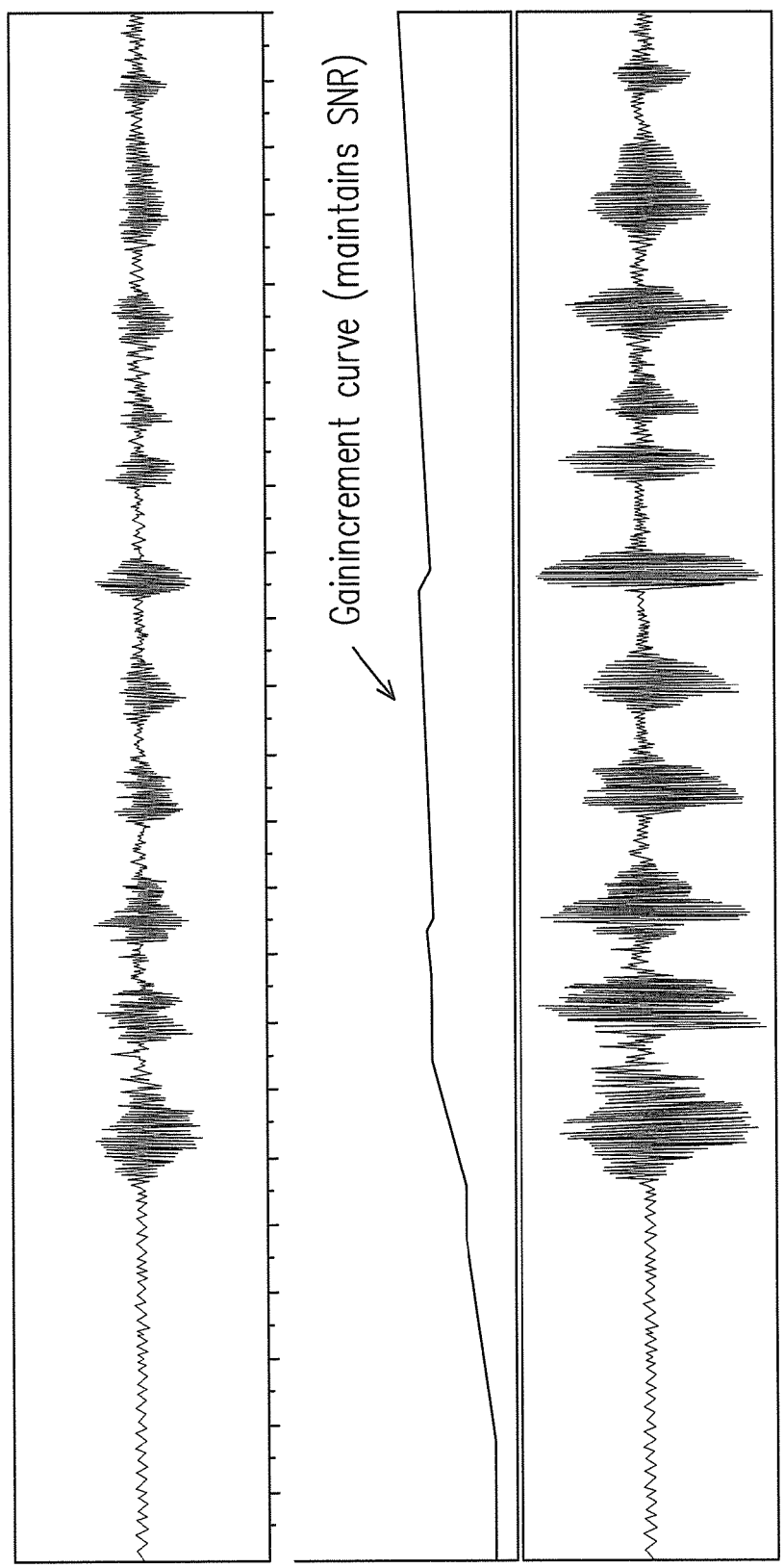
FIG. 4 is an experimental result that illustrates using automatic gain control (AGC) to stabilize volume to improve threshold accuracy in spatial direction of arrival signal.
Figure 5:
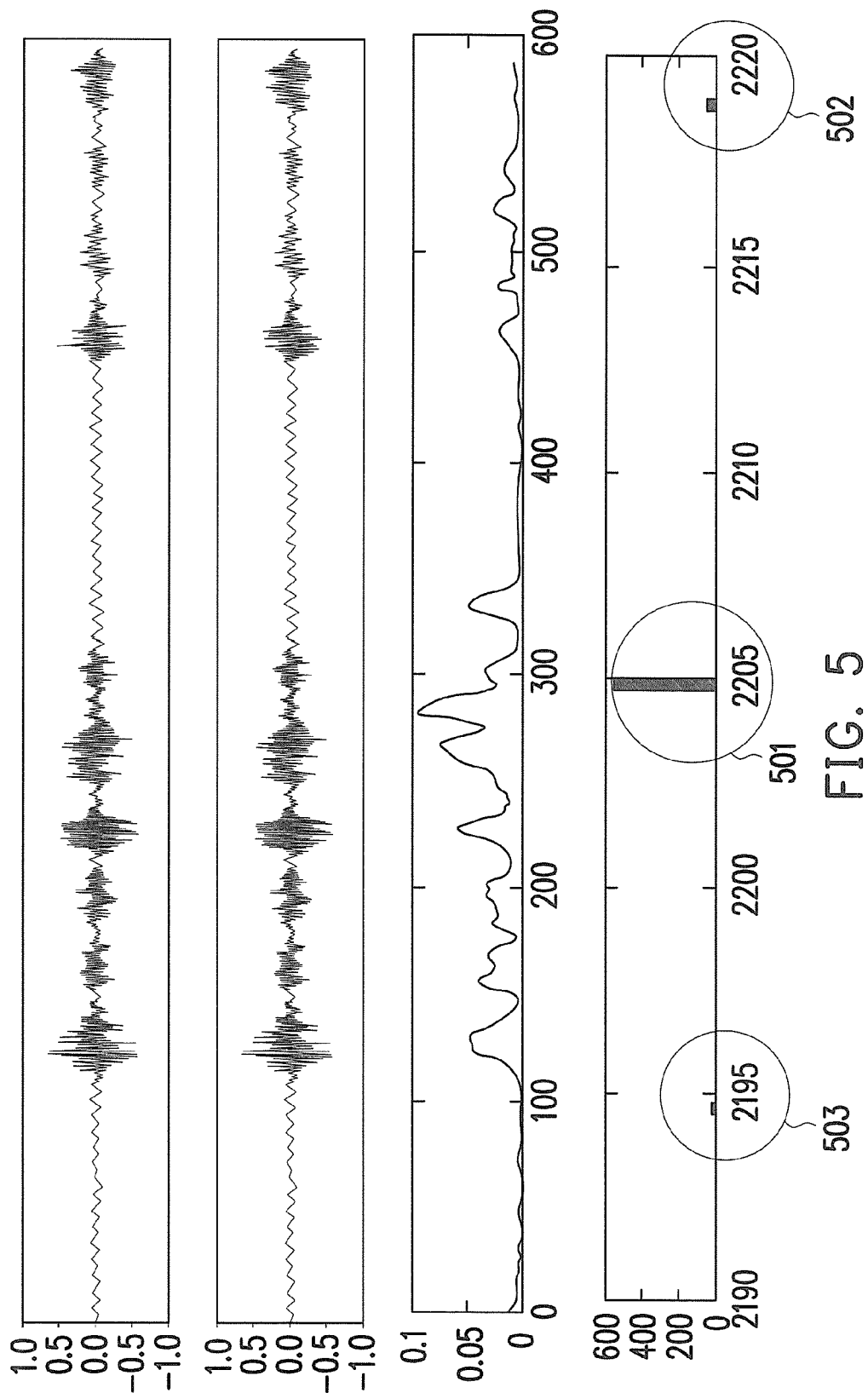
FIG. 5 is an experimental result that illustrates excitation source detection using TDOA.
Figure 6:
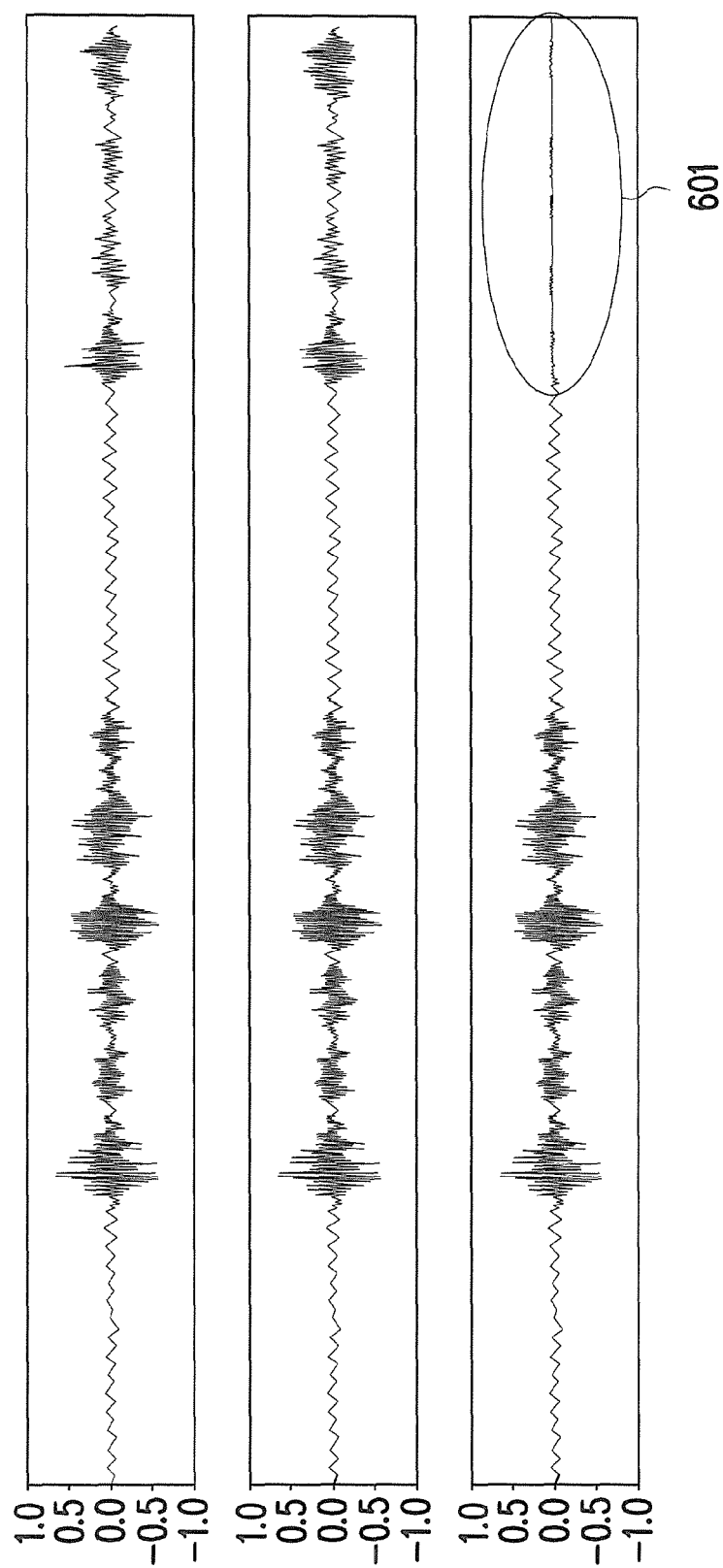
FIG. 6 is an experimental result that illustrates filtering out undesired user direction.

FIG. 4~FIG. 6 would serve to illustrate examples of the FIG. 2 by using various plots from experiment. FIG. 4~FIG. 6 will be referred to along with FIG. 2 in the rest of the written description. FIG. 4 is an experimental result that corresponds to step S202 and illustrates using automatic gain control (AGC) to stabilize volume to improve threshold accuracy in spatial direction of arrival signal. It can be seen in FIG. 4 that the top signal is a captured audio signal that is plotted in the time domain. After applying the captured audio signal to a gain profile that is shown in the gain increment curve served to main a steady signal to noise ratio, the bottom curve is the result of the gain adjusted audio signal. The AGC would automatically adjust the gain profile so as to maintain a steady level of captured audio signal.

FIG. 5 is an experimental result that corresponds to step S203 and step S204 of FIG. 2 and illustrates excitation source detection using TDOA. The top two graphs show the audio signals captured by two different microphones. The third graph from the top shows the energy plot of the LPC residue of the two different microphones. The normalized energy is plotted in the vertical axis and the time is shown in the horizontal axis. The bottom graph of FIG. 5 is a histogram of the correlation of the audio signals (LPC residue) captured by the two different microphones. The histogram shows a dominant audio source 501, a secondary audio source 502, and possibly a third source 503 which is barely audible (might be small noise) and could be ignored if dropped below a threshold. For this example, the dominant user is directly opposite to the at least two microphones (at 90 degrees) and the secondary user is to the left of the at least two microphones (at 30 degrees).

FIG. 6 is an experimental result that corresponds to step S205 and illustrates filtering out undesired user direction. An adaptive filter like a LMS filter has been used. As the result of temporal masking, it could be seen that the section 601 of audio wave form in the undesired direction has been significantly lowered in volume.

Figure 7:
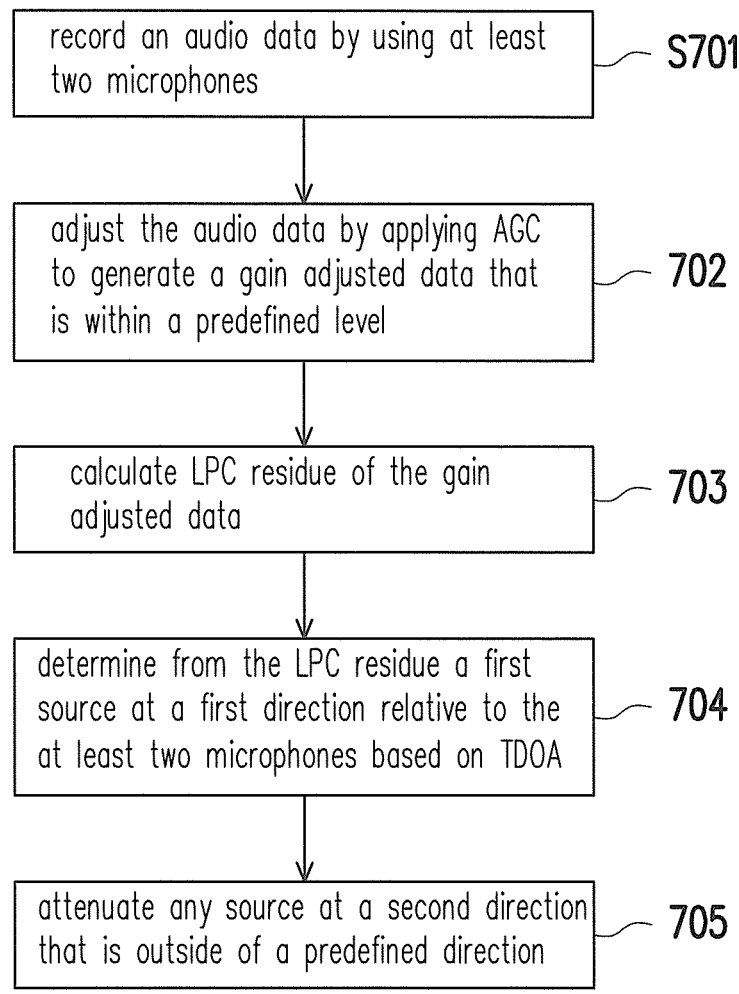
FIG. 7 is a flow chart that illustrates an audio capturing enhancement method in accordance with one of the exemplary embodiment of the present disclosure.

FIG. 7 is a flow chart that illustrates an audio capturing enhancement method in accordance with one of the exemplary embodiment of the present disclosure. In step S701, an audio capturing system records an audio data by using at least two microphones. In step S702, after the audio data has been recorded, the audio capturing system adjusts the audio data by applying automatic gain control (AGC) in order to generate a gain adjusted data that is within a predefined level. In step S703, the audio capturing system calculates a linear predictive coding (LPC) residue of the gain adjusted data. In step S704, the audio capturing system determines from the LPC residue a first source at a first direction relative to the at least two microphones based on time difference of arrival (TDOA). The first source could be a dominant sound source, and the first direction is within a predefined angle. In step S705, the audio capturing system attenuates any source at a second direction that is outside of the predefined angle.

The audio capturing system may adjust the audio data by applying AGC in order to generate the gain adjusted data having a predefined upper limit and a predefined lower limit, wherein the center of the predefined upper limit and the predefined lower limit is at a fraction of a dynamic range of the Mic. The fraction of the dynamic range of the Mic could be, for example, 0.25.

Said first source determined from the LPC residue at the first direction relative to the at least two microphones based on TDOA may include steps of defining a cone having an angle of acceptance and a maximum distance relative to the at least two microphones, counting the number of sources within the cone, and assigning the dominant source as the first source. The number of sources within the cone could be determined based on calculating a correlation of LPC residues of the at least two microphones, generating a histogram of the correlation of LPC residues, and counting the number of peaks exceeding a predefined threshold as the number of sources. Said first direction of the first source relative to the at least two microphones could be determined based on the difference of the arrival of the first source between the at least two microphones.

Said attenuating any source at a second direction that is outside of a predefined angle could include steps of filtering out any source that is outside of the angle of acceptance and filtering out any source that is beyond the maximum distance.

The calculation of the LPC residue of the gain adjusted data may include calculating LPC coefficients of the gain adjusted data and calculating LPC residue by applying inverse filtering to the LPC coefficients.

The audio capturing system may further enable voice activated detection to determine whether the first source is a human voice and eliminate the first source from the audio data if the first source is not a human voice. The audio capturing system may also disable voice activated detection if to detect the first source that is non-human.

In view of the aforementioned descriptions, the present disclosure is suitable for being used in an electronic device and is able to enhance the accuracy and efficiency of an audio capturing system by identifying and filtering undesired sources at a specific direction according to LPC residue based TDOA techniques.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of," "any combination of," "any multiple of," and/or "any combination of multiples of the items and/or the categories of items," individually or in conjunction with other items and/or other categories of items. Further, as used herein, the term "set" is intended to include any number of items, including zero. Further, as used herein, the term "number" is intended to include any number, including zero.

In all the drawings of the present disclosure, a box enclosed by dotted lines would mean an optional functional element or an optional step, and a dotted line may mean that the process flow could be optional or may not necessarily occur.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

Moreover, the claims should not be read as limited to the described order or elements unless stated to that effect. In addition, use of the term "means" in any claim is intended to invoke 35 U.S.C. §112, ¶6, and any claim without the word "means" is not so intended.

What is claimed is:
1. An audio capturing enhancement method comprising:
    recording an audio data by using at least two microphones;
    adjusting the audio data by applying automatic gain control (AGC) in order to generate a gain adjusted data that is within a predefined level;
    calculating a linear predictive coding (LPC) residue of the gain adjusted data;
    defining a cone having an angle of acceptance and a maximum distance relative to the at least two microphones;
    after calculating the LPC residue of the gain adjusted data and the cone has being defined, determining, from the LPC residue, a first source at a first direction and a second source at a second direction within the defined cone based on time different of arrival (TDOA), wherein the first and second directions are relative to the at least two microphones;
    attenuating any source at a third direction that is outside of the defined cone;
    identifying the first source as the dominate source over the second source through a correlation of LPC residues of the at least two microphones;
    enabling voice activated detection to determine whether the first source is a human voice if the first source is identified as the dominate source among the first and second sources; and
    eliminating the first source from the audio data if the first source is not a human voice.
2. The method of claim 1, wherein adjusting the audio data by applying AGC in order to generate the gain adjusted data that is within a predefined level comprising:
    adjusting the audio data by applying AGC in order to generate the gain adjusted data having a predefined upper limit and a predefined lower limit, wherein the center of the predefined upper limit and the predefined lower limit is at a fraction of a dynamic range of the AGC.

3. The method of claim 1, wherein the fraction of the dynamic range of the AGC is 0.25.
4. The method of claim 1, further comprising:
    counting the number of sources within the cone by using the LPC residue.
5. The method of claim 4, wherein counting the number of sources within the cone comprising:
    calculating a correlation of LCA residues of the at least two microphones;
    generating a histogram of the correlation of LPC residues; and
    counting the number of peaks exceeding a predefined threshold as the number of sources.
6. The method of claim 1, wherein:
    calculating the first direction of the first source relative to the at least two microphones is based on the difference of the arrival of the first source between the at least two microphones.
7. The method of claim 1, wherein attenuating any source at third direction that is outside of the predefined cone comprising:
    filtering out any source that is outside of the angle of acceptance; and
    filtering out any source that is beyond the maximum distance.
8. The method of claim 1, wherein calculating the LPC residue of the gain adjusted data comprising:
    calculating LPC coefficients of the gain adjusted data; and
    calculating LPC residue by applying inverse filtering to the LPC coefficients.
9. The method of claim 1 further comprising:
    disabling voice activated detection if to detect the first source that is non-human.
10. An audio capturing system comprising:
    at least two microphones for recording an audio data;
    an amplifier coupled to the at least two microphones for adjusting the audio data by applying automatic gain control (AGC) in order to generate a gain adjusted data that is within a predefined level; and
    a processing circuit coupled to the amplifier for:
        calculating a linear predictive coding (LPC) residue of the gain adjusted data;
        defining a cone having an angle of acceptance and a maximum distance relative to the at least two microphones;
        after calculating the LPC residue of the gain adjusted data and the cone ha being defined, determining, from the LPC residue, a first source at a first direction and a second source at a second direction based on time different of arrival (TDOA), wherein the first and second directions are relative to the at least two microphones;
        attenuating any source at a third direction that is outside of the defined cone
        identifying the first source as the dominate source over the second source through a correlation of LPC residues of the at least two microphones;
        enabling voice activated detection to determine whether the first source is a human voice if the first source is identified as the dominate source among the first and second sources; and
        eliminating the first source from the audio data if the first source is not a human voice.
11. The system of claim 10, wherein the amplifier adjusting the audio data by applying AGC in order to generate the gain adjusted data that is within a predefined level comprising:

the amplifier adjusting the audio data by applying AGC in order to generate the gain adjusted data having a predefined upper limit and a predefined lower limit, wherein the center of the predefined upper limit and the predefined lower limit is at a fraction of a dynamic range of the AGC.

12. The system of claim 10, wherein the fraction of the dynamic range of the AGC is 0.25.

13. The system of claim 10, wherein
the processing circuit counting the number of sources within the cone by using the LPC residue.

14. The system of claim 13, wherein the processing circuit counting the number of sources within the cone comprising:
the processing circuit calculating a correlation of LCA residues of the at least two microphones;
the processing circuit generating a histogram of the correlation of LPC residues; and
the processing circuit counting the number of peaks exceeding a predefined threshold as the number of sources.

15. The system of claim 10, wherein:
the processing circuit calculating the first direction of the first source relative to the at least two microphones is based on the difference of the arrival of the first source between the at least two microphones.

16. The system of claim 10, wherein the processing circuit attenuating any source at the third direction that is outside of the predefined cone comprising:
the processing circuit filtering out any source that is outside of the angle of acceptance; and
the processing circuit filtering out any source that is beyond the maximum distance.

17. The system of claim 10, wherein the processing circuit calculating the LPC residue of the gain adjusted data comprising:
the processing circuit calculating LPC coefficients of the gain adjusted data; and
the processing circuit calculating LPC residue by applying inverse filtering to the LPC coefficients.

18. The system of claim 10, wherein the voice activated detection circuit is further configured for:
disabling voice activated detection in order to detect a non-human source.

19. The method of claim 1, further comprising:
generating a text file based on the first source if the first source is determined to be a human voice.

20. The system of claim 10, wherein the voice activated detection circuit is further configured for: generating a text file based on the first source if the first source is determined to be a human voice.

* * * * *